United States Patent
Martin et al.

(10) Patent No.: US 7,486,588 B2
(45) Date of Patent: Feb. 3, 2009

(54) METHOD AND APPARATUS FOR DRIVER CIRCUIT TO PROVIDE A DESIRED VOLTAGE LEVEL TO A DEVICE

(75) Inventors: Eric Martin, Corvallis, OR (US); Edward Enciso, Corvallis, OR (US); Stanley J. Wang, Albany, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/622,903

(22) Filed: Jan. 12, 2007

(65) Prior Publication Data

US 2007/0115740 A1   May 24, 2007

Related U.S. Application Data

(62) Division of application No. 11/054,075, filed on Feb. 8, 2005, now Pat. No. 7,203,111.

(51) Int. Cl.
*G11C 8/00* (2006.01)

(52) U.S. Cl. .............. 365/230.06; 365/203; 345/90

(58) Field of Classification Search ............. 365/203 X, 365/230.06 X, 203, 203.06; 345/90 X, 91, 345/98, 90
See application file for complete search history.

(56) References Cited

U.S. PATENT DOCUMENTS

| | | | |
|---|---|---|---|
| 5,550,773 A | 8/1996 | Woerlee et al. | |
| 5,682,174 A | 10/1997 | Chiu | |
| 6,084,580 A * | 7/2000 | Takahashi et al. | 345/211 |
| 6,473,361 B1 | 10/2002 | Chen et al. | |
| 6,542,142 B2 * | 4/2003 | Yumoto et al. | 345/90 |
| 6,543,286 B2 | 4/2003 | Garverick et al. | |
| 6,826,112 B2 | 11/2004 | Ku et al. | |
| 6,940,770 B2 | 9/2005 | Ku et al. | |
| 6,970,031 B1 | 11/2005 | Martin et al. | |
| 7,151,627 B2 * | 12/2006 | Starkweather et al. | 359/291 |
| 7,358,935 B2 * | 4/2008 | Yamashita et al. | 345/76 |

* cited by examiner

*Primary Examiner*—VanThu Nguyen

(57) ABSTRACT

A method includes a row precharge voltage applied to a node and a column voltage that is set. A row enable signal is pulsed to a switching device coupled between the node and the column voltage to cause the node voltage to be lowered to a desired level.

20 Claims, 5 Drawing Sheets

100

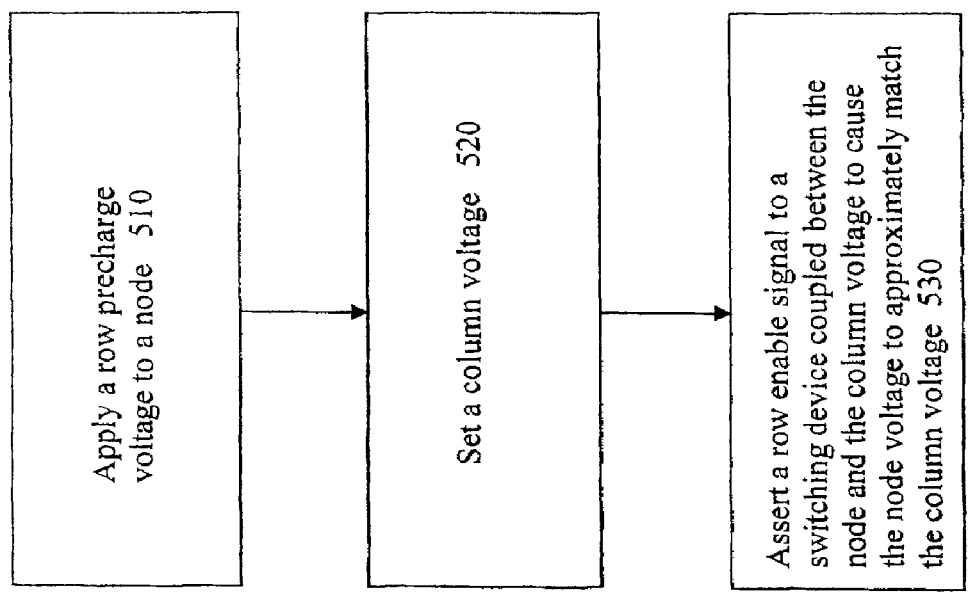

METHOD AND APPARATUS FOR DRIVER CIRCUIT TO PROVIDE A DESIRED VOLTAGE LEVEL TO A DEVICE

CROSS REFERENCE TO RELATED APPLICATIONS

This Application is a divisional of U.S. application Ser. No. 11/054,075, filed Feb. 8, 2005 now U.S. Pat. No. 7,203,111 which is hereby incorporated by reference.

BACKGROUND

Micro-electromechanical system (MEMS) devices may be described as devices that embed mechanical technologies (mirrors, actuators, various types of sensors, etc.) in semiconductor components. MEMS device actuation voltages may exceed the typical operating voltages for conventional complementary metal oxide semiconductor (CMOS) processes. In order to accommodate greater voltages, MEMS device driver circuits may include devices that are larger than would be required for lower voltage levels. An increase in device size in order to accommodate higher voltages may be undesirable in some applications, including applications that benefit from greater device density packing such as with MEMS actuator arrays. MEMS actuator arrays may be found in a variety of device types, including, but not limited to, light modulation devices such as projectors.

BRIEF DESCRIPTION OF THE DRAWINGS

The claimed subject matter will be understood more fully from the detailed description given below and from the accompanying drawings of embodiments which, however, should not be taken to limit the claimed subject matter to the specific embodiments described, but are for explanation and understanding only.

FIG. 5 is a flow diagram of one embodiment of an example method for a driver circuit.

DETAILED DESCRIPTION

Figure 1:
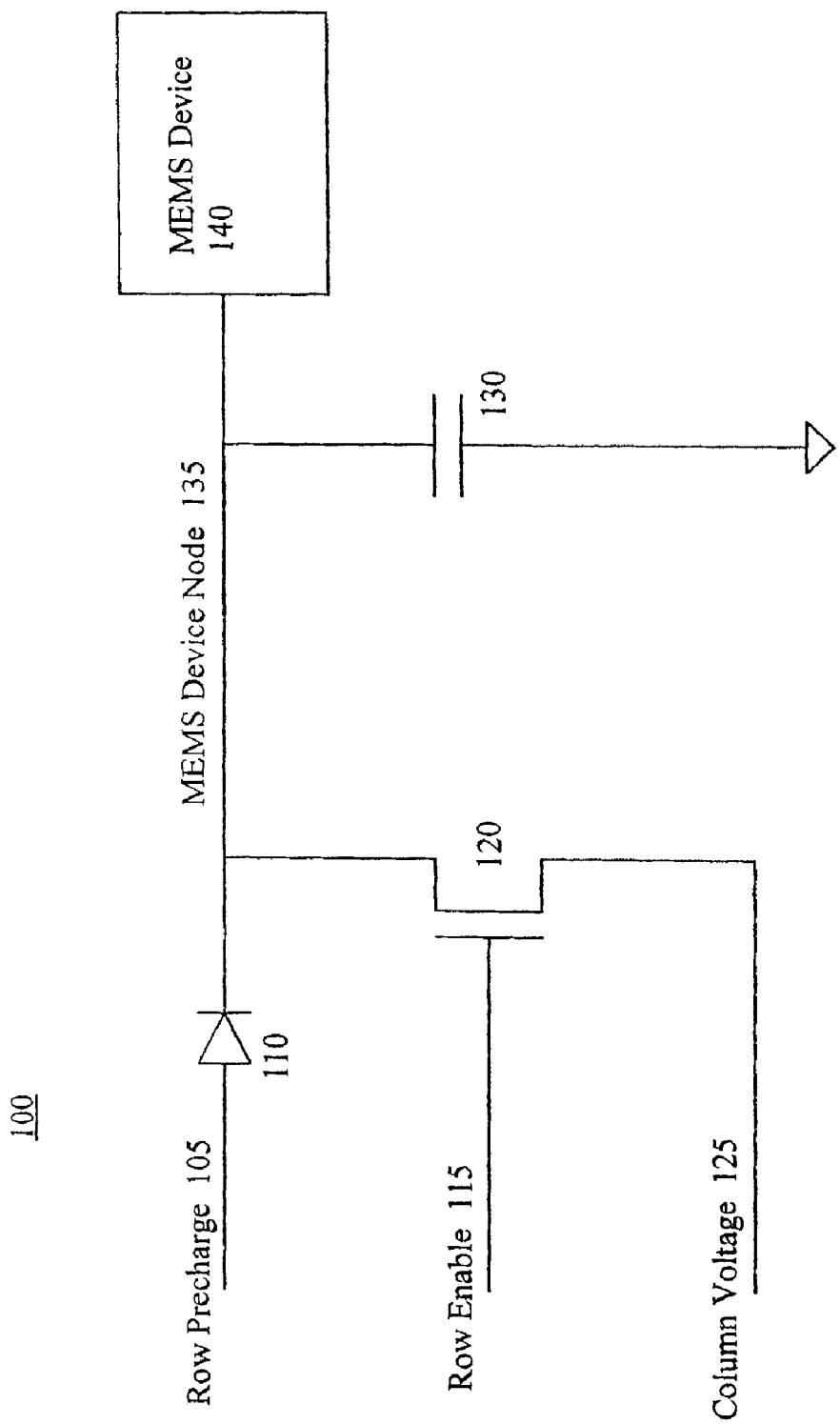
FIG. 1 is a block diagram of one embodiment of an example driver circuit.

FIG. 1 is a block diagram of one embodiment of an example driver circuit 100. For this example embodiment, a MEMS device node 135 is coupled to a MEMS device 140. Although this example embodiment and other embodiments described below discuss MEMS devices, other embodiments are possible where other types of devices are coupled to the driver circuitry.

Again referring to FIG. 1, a row precharge signal 105 is connected to a diode 110. Diode 110 is situated between row precharge signal 105 and MEMS device node 135. A transistor 120 is coupled between MEMS device node 135 and a column voltage 125. A row enable signal 115 is coupled to the gate of transistor 120.

Although the example circuit 100 includes diode 110, other embodiments are possible using other device types that would allow current to flow to MEMS device node 135 when a sufficiently high voltage level is present on row precharge signal 105. Further, although for this example embodiment transistor 120 is a MOS transistor, other embodiments are possible using other types of transistors and/or switching devices.

Driver circuit 100 may be used as part of an addressable array of MEMS device actuators, as can be seen by the use of "row" and "column" terminologies for signals 105, 115, and 125. However, other embodiments are possible where circuit 100 is not part of an addressable array.

Example driver circuit 100 may also include a capacitor 130 coupled between MEMS device node 135 and ground in order to hold voltage and to minimize coupling across the diode junction.

In order to write a desired voltage to MEMS device node 135, row precharge signal 105 is pulsed to a value approximately equal to a maximum supply voltage VPP then returns to approximately 0V. When row precharge signal 105 is asserted, current flows through diode 110, pre-charging MEMS device node 135 to a voltage level approximately equal to VPP minus the threshold drop across diode 110. Once MEMS device node 135 has been pre-charged, row enable signal 115 and column voltage 125 can be set up to discharge an appropriate amount of charge from the MEMS device node 135 so that it is set at a desired voltage. One possible embodiment includes setting column voltage 125 to the desired voltage and then asserting row enable signal 115 to allow current to flow from MEMS device node 135 to column voltage 125, thereby allowing MEMS device node 135 to settle at the desired voltage. An example of this type of embodiment is discussed below in connection with FIG. 2. Another possible embodiment involves controlling the pulse width and magnitude of row enable signal 115 in order to controllable bleed charge from node 135. Column voltage may also be set to allow for partial discharge of MEMS device node 135 to cause MEMS device node to reach the desired voltage level. An example of this type of embodiment is discussed below in connection with FIG. 3.

Figure 2:
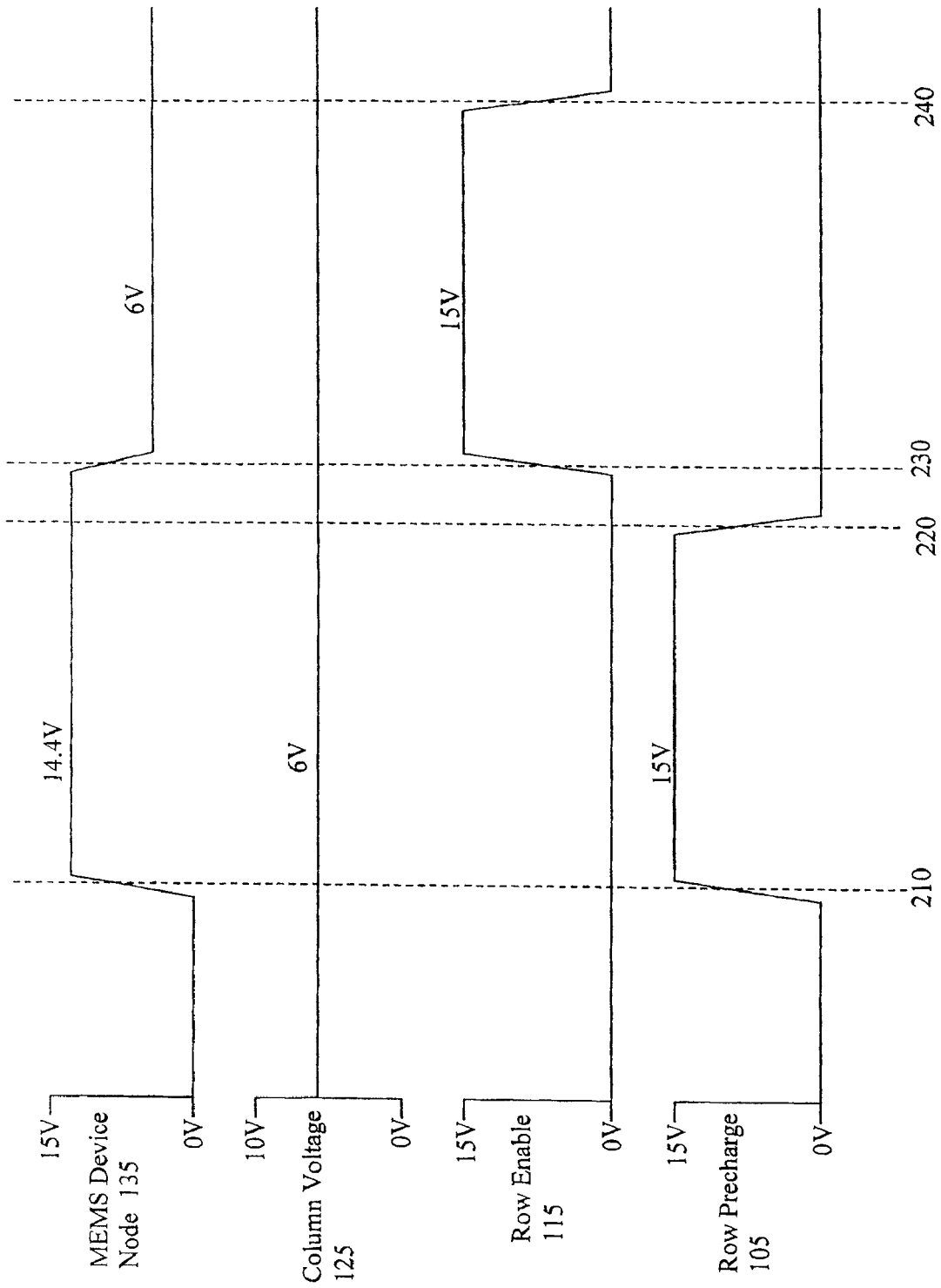
FIG. 2 is an example timing diagram corresponding to the example embodiment of FIG. 1.

FIG. 2 is an example timing diagram corresponding to the example embodiment of FIG. 1. At time 210, row precharge signal 105 is asserted to approximately 15V. Current then flows through diode 110 and approximately 14.4V appears on MEMS device node 135. The difference in voltage between row precharge signal 105 and MEMS device node 135 is due to the forward biased voltage drop across diode 110.

At time 210, column voltage 125 for this example is at approximately 6V. This voltage represents the desired eventual voltage for MEMS device node 135. Also for this example, at time 210 row enable signal 115 is not asserted.

At time 220, row precharge signal 105 returns to approximately 0V. At time 230, row enable signal 115 is driven to approximately 15V. This assertion of row enable signal 115 allows current to flow through transistor 120, causing MEMS device node 135 to approximately match column voltage 125. For this example, the voltage on MEMS device node 135 is approximately 6V. Lastly, for this example, at time 240 row enable signal 115 returns to approximately 0V.

In the example above, the various voltage levels discussed are for example purposes only, and various embodiments are possible with a wide range of possible voltages for the various signals and nodes. Further, there is a wide range of possible timing relationships among the various signals.

Figure 3:
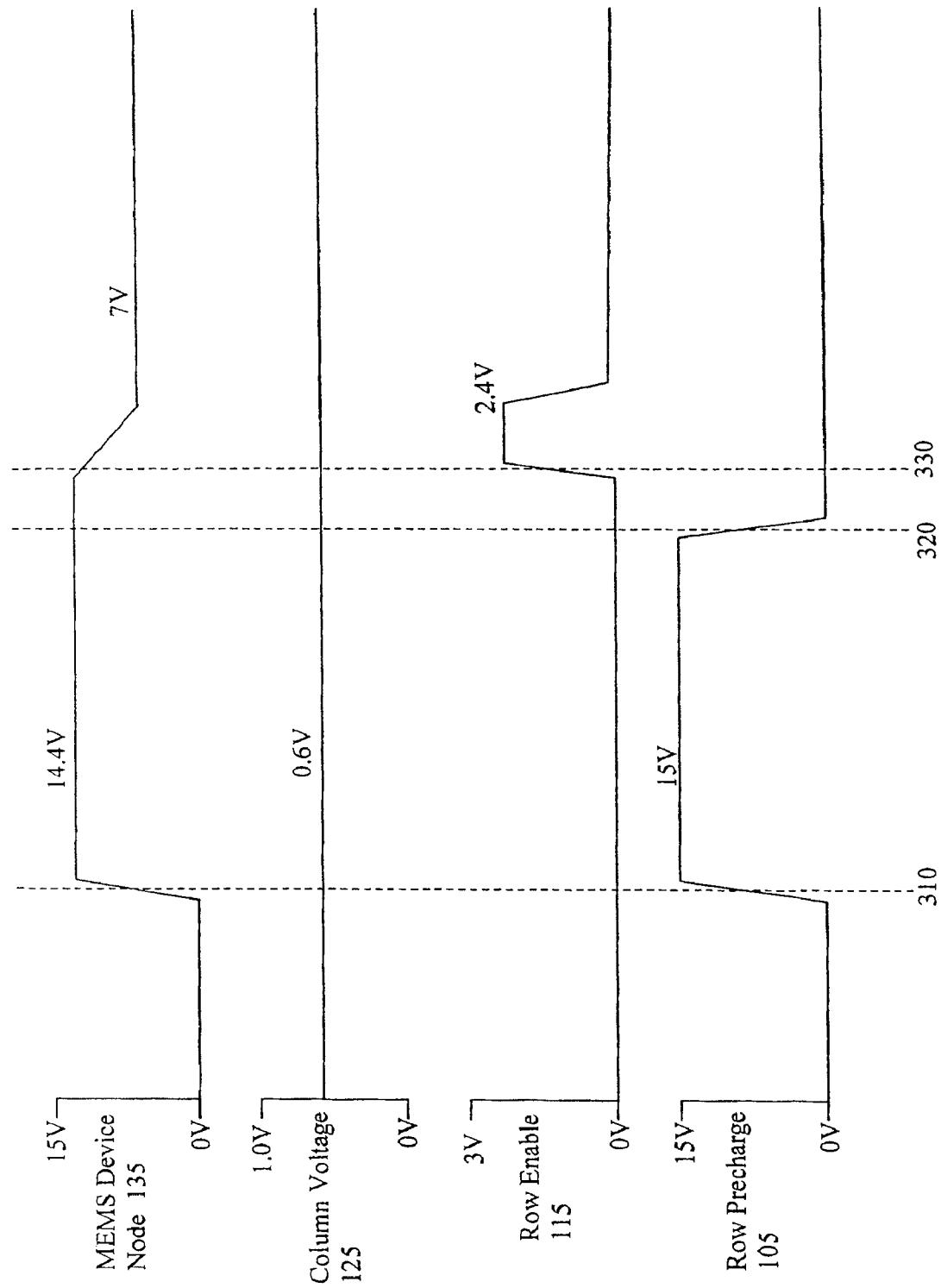
FIG. 3 is an additional example timing diagram corresponding to the example embodiment of FIG. 1.

FIG. 3 is an additional example timing diagram corresponding to the example embodiment of FIG. 1. At time 310, row precharge signal 105 is asserted to approximately 15V. Current then flows through diode 110 and approximately 14.4V appears on MEMS device node 135. The difference in voltage between row precharge signal 105 and MEMS device node 135 is due to the forward biased voltage drop across diode 110.

At time 310, column voltage 125 for this example is at approximately 0.6V. Also for this example, at time 310 row enable signal 115 is not asserted.

At time 320, row precharge signal 105 returns to approximately 0V.

At time 330, row enable signal 115 is pulsed. For this example, the magnitude of the row enable signal 115 pulse is approximately 2.4V. Upon the pulse of row enable signal 115, current flows through transistor 120. MEMS device node 135 reaches a voltage level of approximately 7V.

The voltage level on MEMS device node 135 may be affected by a combination of the value of column voltage 125, the magnitude and width of the row precharge signal 115 pulse, the voltage level of row precharge signal 105, and the number of times row enable signal 115 is pulsed. By modulating any or all of these various factors, a range of voltage levels from approximately 0V to approximately 14.4V can be achieved on MEMS device node 135.

An intended advantage of setting column voltage 125 at a lower level (perhaps lower than 1V) and pulsing row enable signal 115 is the reduction of the body effects of transistor 120 so that a full range of voltages from 0V to a diode threshold drop below the row precharge voltage level can be achieved at MEMS device node 135. Also, because of the reduced magnitude of the row enable pulse, low-voltage row drivers may be used instead of larger and/or more complex high-voltage drivers. Additionally, because the source voltage for transistor 120 never sees a high voltage in this example, transistor 120 can be an asymmetrical transistor type, resulting in a smaller device. Likewise, because the column voltage level in this example is a low-voltage signal, the complexity and size of associated column switching circuitry can be reduced.

As with previous examples, in the example of FIG. 3, the various voltage levels discussed are for example purposes only, and various embodiments are possible with a wide range of possible voltages for the various signals and nodes. Further, there is a wide range of possible timing relationships among the various signals.

Figure 4:
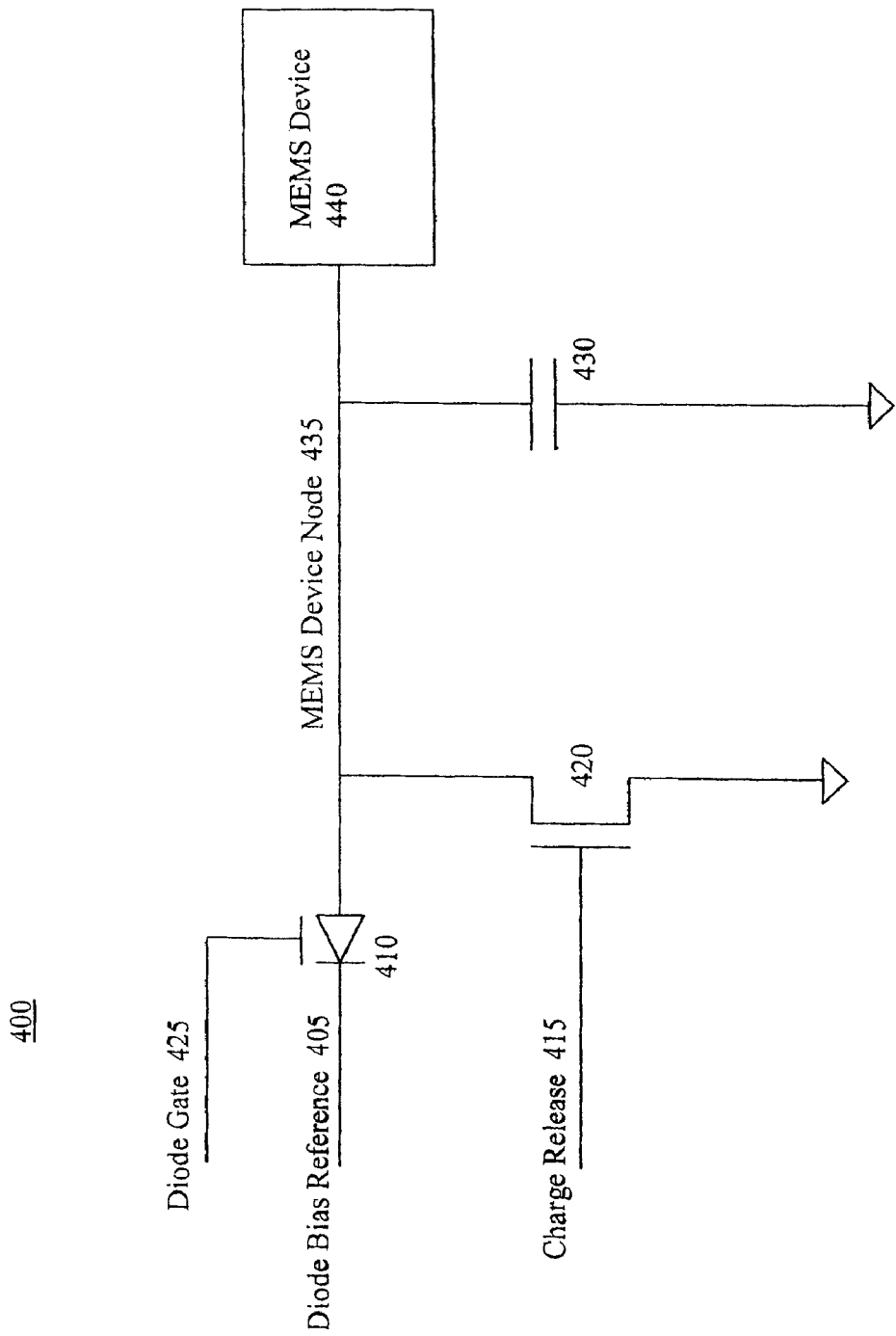
FIG. 4 is a block diagram of another embodiment of an example driver circuit.

FIG. 4 is a block diagram of another embodiment of an example driver circuit 400. For this example embodiment, a MEMS device node 435 is coupled to a MEMS device 440. Although this example embodiment discusses a MEMS device, other embodiments are possible where other types of devices are coupled to the driver circuitry.

Referring again to FIG. 4, a diode bias reference signal 405 is connected to a gated diode 410. Gated diode 410 is situated between diode bias reference signal 405 and MEMS device node 435. A transistor 420 is coupled between MEMS device node 435 and ground. A charge release signal 415 is coupled to the gate of transistor 420. Although for this example embodiment transistor 120 is a MOS transistor, other embodiments are possible using other types of transistors and/or switching devices.

In order to precharge MEMS device node 435, diode gate signal 425 is asserted allowing current to flow between diode bias reference signal 405 and MEMS device node 435. In this manner, the voltage on diode bias reference 405 is approximately matched on MEMS device node 435. Once MEMS device node 435 reaches a voltage that approximately matches the voltage on diode bias reference 405, diode gate signal 425 is deasserted. The charge release signal 415 can then be asserted, turning on transistor 420, in order to bleed a desired amount of charge from MEMS device node 435 to cause MEMS device node 435 to reach a desired voltage level.

Example driver circuit 400 may also include a capacitor 430 coupled between MEMS device node 435 and ground.

As with previous examples, various embodiments related to the example embodiment of FIG. 4 are possible with a wide range of possible voltages for the various signals and nodes. Further, there is a wide range of possible timing relationships among the various signals FIG. 5 is a flow diagram of one embodiment of an example method for a driver circuit. At block 510, a row precharge voltage is applied to a node. A column voltage representing the desired eventual node voltage is set at block 520. Then, at block 530, a row enable signal is asserted to a switching device coupled between the node and the column voltage to cause the node voltage to approximately match the column voltage.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments.

In the foregoing specification the claimed subject matter has been described with reference to specific example embodiments thereof. It will, however, be evident that various modifications and changes may be made thereto without departing from the broader spirit and scope of the subject matter as set forth in the appended claims. The specification and drawings are, accordingly, to be regarded in an illustrative rather than in a restrictive sense.

What is claimed is:

1. A method, comprising:
    applying a row precharge voltage to a node;
    setting a column voltage; and
    pulsing a row enable signal to a switching device coupled between the node and the column voltage to cause the node voltage to be lowered to a desired level, wherein the switching device is a transistor of an asymmetric transistor type;
    wherein pulsing a row enable signal includes modulating a row enable signal pulse magnitude to cause the node voltage to be lowered to the desired level.

2. The method of claim 1, wherein pulsing a row enable signal includes modulating a row enable signal pulse width to cause the node voltage to be lowered to the desired level.

3. The method of claim 1, wherein pulsing a row enable signal includes periodically pulsing the raw enable signal following an assertion of the row precharge signal.

4. The method of claim 1, wherein setting a column voltage includes setting the column voltage to a voltage less that 1V.

5. The method of claim 1, wherein applying a row precharge voltage to a node includes applying a row precharge voltage to an anode of a diode.

6. The method of claim 5, wherein applying a row precharge voltage to a node further includes coupling a cathode of the diode to the node.

7. The method of claim 6, wherein applying a row precharge voltage to a node further includes applying a row precharge voltage to a MEMS device coupled to the node.

8. An apparatus comprising one or more semiconductor devices adapted to provide an input node signal to a MEMS device, as follows:
    applying a row precharge voltage to an input node;

setting a column voltage; and pulsing a row enable signal to a switching device coupled between the input node and the column voltage to cause the input node voltage to be lowered to a desired level, wherein the switching devise is a transistor of an asymmetric transistor type;

wherein pulsing a row enable signal includes modulating a row enable signal pulse magnitude to cause the input node voltage to be lowered to the desired level.

9. The apparatus of claim 8, wherein pulsing a row enable signal includes modulating a row enable signal pulse width to cause the input node voltage to be lowered to the desired level.

10. The apparatus of claim 8, wherein pulsing a row enable signal includes periodically pulsing the row enable signal following an assertion of die row precharge signal.

11. The apparatus of claim 8, wherein setting a column voltage includes sorting the column voltage to a voltage less that 1V.

12. The apparatus of claim 8, wherein applying a row precharge voltage to an input node includes applying a row precharge voltage to an anode of a diode.

13. The apparatus of claim 12, wherein applying a row precharge voltage to an input node further includes coupling a cathode of the diode to the input node.

14. The apparatus of claim 13, wherein applying a row precharge voltage to an input node further includes applying a row precharge voltage to a MEMS device coupled to the input node.

15. A method, comprising:

coupling a diode between a row precharge signal and an input node; and coupling a switching device between the input node and a column voltage signal, wherein the switching device is a transistor of an asymmetric transistor type;

wherein a minimum voltage settable at the input node is substantially a voltage level of the column voltage signal.

16. The method of claim 15, wherein coupling a switching device between the input node and the column voltage signal includes coupling a transistor between the input node and the column voltage signal.

17. The method of claim 16, further comprising coupling a row enable signal to a gate terminal of the transistor.

18. The method of claim 17, further comprising coupling the input node to a MEMS device.

19. The method of claim 1, wherein setting the column voltage includes:

setting the column voltage such that the desired level of the node voltage is based on the column voltage and is at a minimum substantially equal to the column voltage.

20. The apparatus of claim 8, wherein the column voltage is set such that the desired level of the node voltage is based on the column voltage and is at a minimum substantially equal to the column voltage.

* * * * *

UNITED STATES PATENT AND TRADEMARK OFFICE
CERTIFICATE OF CORRECTION

PATENT NO. : 7,486,588 B2 Page 1 of 1
APPLICATION NO. : 11/622903
DATED : February 3, 2009
INVENTOR(S) : Eric Martin et al.

It is certified that error appears in the above-identified patent and that said Letters Patent is hereby corrected as shown below:

In column 4, line 51, in Claim 3, delete "raw" and insert -- row --, therefor.

In column 4, line 54, in Claim 4, delete "that" and insert -- than --, therefor.

In column 5, line 5, in Claim 8, delete "devise" and insert -- device --, therefor.

In column 5, line 15, in Claim 10, delete "die" and insert -- the --, therefor.

In column 5, line 17, in Claim 11, delete "sorting" and insert -- setting --, therefor.

In column 5, line 18, in Claim 11, delete "that" and insert -- than --, therefor.

Signed and Sealed this

Second Day of June, 2009

JOHN DOLL
*Acting Director of the United States Patent and Trademark Office*